United States Patent [19]
Pinneo et al.

[11] Patent Number: 5,223,672
[45] Date of Patent: Jun. 29, 1993

[54] HERMETICALLY SEALED ALUMINUM PACKAGE FOR HYBRID MICROCIRCUITS

[75] Inventors: George G. Pinneo, Manhattan Beach; Marijan D. Grgas, San Pedro, both of Calif.

[73] Assignee: TRW Inc., Redondo Beach, Calif.

[21] Appl. No.: 535,628

[22] Filed: Jun. 11, 1990

[51] Int. Cl.⁵ .................... H01L 23/02; H01B 17/26
[52] U.S. Cl. ........................... 174/52.4; 174/152 GM; 228/113; 228/114; 156/73.5
[58] Field of Search ........... 174/52.4, 50.61, 152 GM, 174/52.1, 52.3; 333/252, 247; 350/96.2, 96.11; 228/112, 113, 114; 156/73.5

[56] References Cited

U.S. PATENT DOCUMENTS

| | | | |
|---|---|---|---|
| 2,450,780 | 10/1948 | Bucklen, 3D | 200/225 |
| 2,458,748 | 1/1949 | Stupakoff | 174/152 GM |
| 3,017,452 | 1/1962 | Rongved | 174/152 GM |
| 3,702,409 | 11/1972 | Goodings et al. | 313/61 D |
| 4,213,004 | 7/1980 | Acker et al. | 174/151 |
| 4,238,043 | 12/1980 | Minami et al. | 220/2.1 R |
| 4,506,108 | 3/1985 | Kersch et al. | 174/52 FP |
| 4,574,299 | 3/1986 | Glascock, II et al. | 357/81 |
| 4,659,245 | 4/1987 | Hirao et al. | 403/30 |
| 4,688,009 | 8/1987 | Ferguson et al. | 333/252 |
| 4,708,060 | 11/1987 | Bickes, Jr. et al. | 102/202.7 |
| 4,746,582 | 5/1988 | Tsuno | 428/627 |
| 4,757,292 | 7/1988 | Basil, Jr. et al. | 333/244 |
| 4,801,488 | 1/1989 | Smith | 428/209 |
| 4,805,009 | 2/1989 | Pryor et al. | 357/70 |
| 4,839,716 | 6/1989 | Butt | 357/74 |
| 4,841,101 | 6/1989 | Pollock | 174/152 G M |
| 4,955,684 | 9/1990 | Shiga | 350/96.2 |
| 4,960,096 | 10/1990 | Sukimoto et al. | 123/570 |
| 5,001,299 | 3/1991 | Hingorany | 174/52.4 |

*Primary Examiner*—Leo P. Picard
*Assistant Examiner*—Bot Lee Ledynh
*Attorney, Agent, or Firm*—James M. Steinberger; G. Gregory Schivley; Ronald L. Taylor

[57] ABSTRACT

A hybrid package in which Kovar feedthroughs are friction welded to an aluminum housing. Friction welding produces a very strong weld joint which resists the thermal stresses induced between the aluminum housing and Kovar feedthroughs by the large difference in their coefficients of thermal expansion. Friction welding also produces a very small heat affected zone, while brazing, soldering and other types of welding produce large heat affected zones which can cause annealing problems. The aluminum package is easy to machine, light in weight and provides good heat dissipation for the hybrid microcircuits in the package.

4 Claims, 2 Drawing Sheets

HERMETICALLY SEALED ALUMINUM PACKAGE FOR HYBRID MICROCIRCUITS

BACKGROUND OF THE INVENTION

This invention relates generally to techniques for packaging electronic devices and, more particularly, to techniques for packaging hybrid microcircuits in hermetically sealed enclosures.

Hybrid microcircuits are devices in which various types of electronic components, such as semiconductor devices, integrated circuits and passive elements, are assembled together in small protective enclosures to fulfill system size requirements that are not easily met by more conventional packaging techniques. The electronic components, which are usually in chip form, are typically attached to an insulating substrate and interconnected by thick- and thin-film deposited networks, primarily of conductors and resistors. The small enclosures, or hybrid packages, protect the hybrid microcircuits from environmental and mechanical damage and allow the microcircuits to be easily handled.

A typical hybrid package includes a boxshaped metal housing having openings in the side walls or bottom of the housing for leads that electrically connect the hybrid microcircuits to external circuits. The leads are sealed into the openings by a sealing glass which hermetically seals the package and electrically insulates the leads from the housing. The housing is generally fabricated from a metal or metal alloy to provide good heat dissipation for the hybrid microcircuits.

The glass to metal bond between the sealing glass and the metal lead and housing must remain both mechanically stable and hermetic as the package expands and contracts due to temperature changes. Therefore, the sealing glass and metal lead and housing must have similar coefficients of thermal expansion (CTE's). Kovar (ASTM F-15 alloy), a metal alloy of nickel, cobalt and iron, and a borosilicate sealing glass, such as Corning 7052, are often used to fabricate these types of packages because they have about the same coefficient of thermal expansion ($47 \times 10^{-7}$ compared to $46 \times 10^{-7}$). When subjected to heating in an oxidizing atmosphere, Kovar forms a continuous refractory oxide layer on its surface which fuses to the borosilicate sealing glass to provide the hermetic seal. This hermetic seal, which typically has a leak rate of $1 \times 10^{-9}$ atm-cc/sec when measured by a helium mass spectrometer, is substantially impervious to diffusion of water vapor and other contaminants.

Unfortunately, Kovar is very difficult to machine and is a relatively heavy metal with poor thermal conductivity. Aluminum produces a much better hybrid package because it is very easy to machine and is a relatively light metal with very good thermal conductivity. However, aluminum has a much larger coefficient of thermal expansion than Kovar, thus preventing borosilicate sealing glasses from being used to directly seal the leads into the openings in an aluminum housing. Kovar feedthroughs, which are preassembled leads having an outer shell or ferrule and center conductor of Kovar with a sealing glass insulator already fused between the shell and center conductor, can be joined to an aluminum housing by soldering. However, the large difference in the CTE's of Kovar and aluminum induce high thermal stresses between the housing and feedthroughs which exceed the capabilities of most solders. U.S. Pat. No. 4,213,004 to Acker et al. discloses a technique for joining Kovar feedthroughs to an aluminum housing by machining a thin annular wall around each opening to allow for expansion of the aluminum housing and then electron beam welding the Kovar feedthroughs to nickel plated edges of the annular walls. However, the thin annular walls require additional machining steps and the use of electron beam welding, which must be performed in a vacuum, requires that the aluminum be plated with nickel. Accordingly, there is still a need for a simple yet effective technique for joining Kovar feedthroughs to an aluminum housing. The present invention clearly fulfills this need.

SUMMARY OF THE INVENTION

The present invention resides in a technique for joining Kovar feedthroughs to an aluminum hybrid package by friction welding the feedthroughs to the package. Briefly, and in general terms, the Kovar feedthroughs are friction welded into openings in an aluminum housing by spinning each feedthrough, for example on a lathe, and then driving the spinning feedthrough into the housing. Friction welding produces a very strong weld joint which resists the thermal stresses induced between the aluminum housing and Kovar feedthroughs by the large difference in their coefficients of thermal expansion (CTE's). Friction welding also produces a very small heat affected zone, while brazing, soldering and other types of welding produce large heat affected zones which can cause annealing problems.

In one technique for joining Kovar feedthroughs to an aluminum housing in accordance with the present invention, each feedthrough includes a flanged Kovar shell, a Kovar center conductor and a borosilicate sealing glass insulator fused between the Kovar shell and the center conductor. In this technique, the flanged portion of the Kovar shell is friction welded to the housing. In an alternative technique, each feedthrough includes a non-flanged Kovar shell which is laser welded to a Kovar ferrule that has been friction welded to the housing.

An alternative type of feedthrough in accordance with the present invention for transmitting microwave or optical signals includes a non-flanged Invar shell and a crystal brazed into the center of the Invar shell. The crystal can be, for example, quartz, sapphire, lithium niobate ($LiNbO_3$), or any other type of crystal providing non-contact transmission of microwave or optical signals. The Invar shell is laser welded to an Invar ferrule that has been friction welded to the housing. Invar, alloy of nickel and iron, is used instead of Kovar because it has a CTE that is closer to the CTE's of the various crystals than Kovar.

It will be appreciated from the foregoing that the present invention represents a significant advance in the field of hybrid packaging techniques. The friction welding technique of the present invention provides an hermetically sealed aluminum hybrid package having a leak rate better than $1 \times 10^{-9}$ atm-cc/sec when measured by a helium mass spectrometer. The aluminum package is easy to machine, light in weight and provides good heat dissipation for the hybrid microcircuits in the package. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 1:
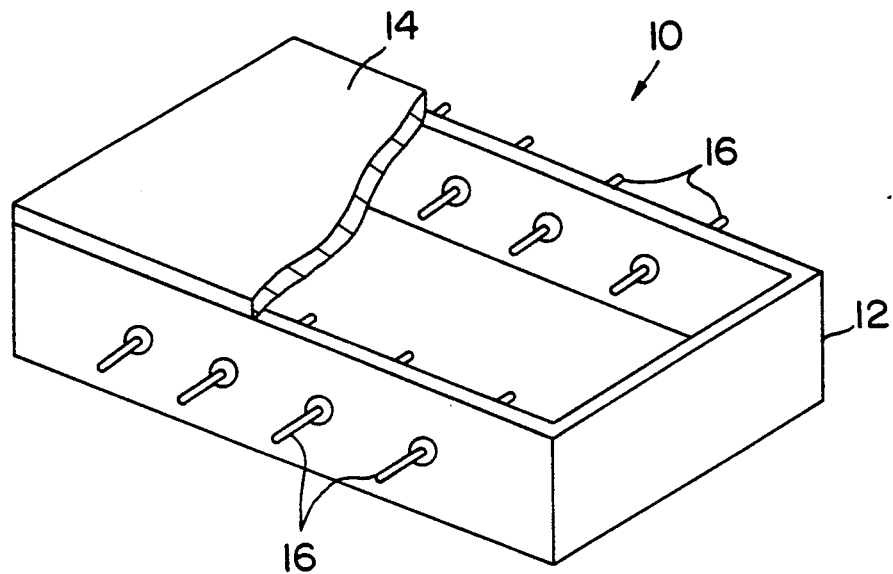
FIG. 1 is a perspective view of an aluminum hybrid package.

As shown in the drawings for purposes of illustration, the present invention is embodied in a technique for joining Kovar feedthroughs to an aluminum hybrid package by friction welding the feedthroughs to the package. Hybrid packages are generally fabricated from a metal or metal alloy to provide good heat dissipation for the hybrid microcircuits in the package. Leads are sealed into openings in the package by a sealing glass which hermetically seals the package and electrically insulates the leads from the package. Kovar (ASTM F-15 alloy), a metal alloy of nickel, cobalt and iron, and a borosilicate sealing glass are often used to fabricate these types of packages because they have similar coefficients of thermal expansion (CTE's). Unfortunately, Kovar is very difficult to machine and is a relatively heavy metal with poor thermal conductivity. Aluminum produces a much better hybrid package because it is very easy to machine and is a relatively light metal with very good thermal conductivity. However, aluminum has a much larger coefficient of thermal expansion than Kovar, thus preventing borosilicate sealing glasses from being used to directly seal the leads into the openings in the aluminum package.

Figure 2:
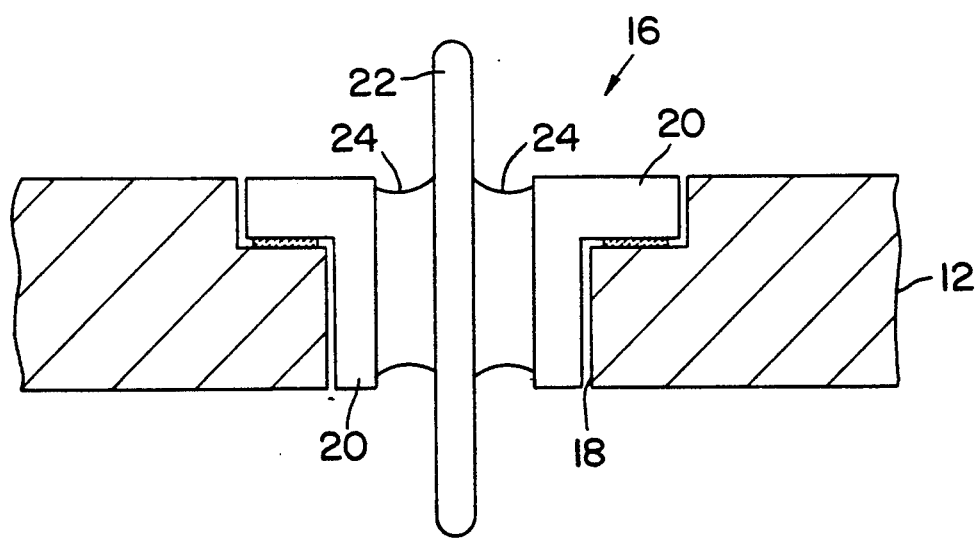
FIG. 2 is an enlarged fragmentary sectional view of one technique in accordance with the present invention for joining a Kovar feedthrough to an aluminum housing.

As illustrated in FIGS. 1 and 2, a hybrid package 10 in accordance with the present invention includes an aluminum housing 12, an aluminum cover 14 and a plurality of Kovar feedthroughs 16 that are friction welded into openings 18 in the side walls or bottom of the housing 12. The Kovar feedthroughs 16 are friction welded into the openings 18 by spinning each feedthrough 16, for example by a lathe, and then driving the spinning feedthrough 16 into the housing 12. Friction welding produces a very strong weld joint which resists the thermal stresses induced between the aluminum housing and Kovar feedthroughs by the large difference in their coefficients of thermal expansion. Friction welding also produces a very small heat affected zone, while brazing, soldering and other types of welding produce large heat affected zones which can cause annealing problems.

As shown in detail in FIG. 2, each feedthrough 16 includes a flanged Kovar shell or ferrule 20, a Kovar center conductor 22 and a borosilicate sealing glass insulator 24 fused between the Kovar shell 20 and the center conductor 22. The flanged portion of the Kovar shell 20 is friction welded to the housing 12 by spinning the feedthrough 16 about the axis of the center conductor 22 and then driving the spinning feedthrough 16 into the housing 12. If a lathe is used for the friction welding, the motor of the lathe is turned on to spin up a flywheel and the spindle holding the feedthrough 16. The motor is then turned off and the spinning feedthrough 16 is driven into the housing 12, causing the spinning flywheel and spindle to come to a stop in approximately one to two seconds. The energy stored in the flywheel is thus imparted to the weld joint.

Figure 3:
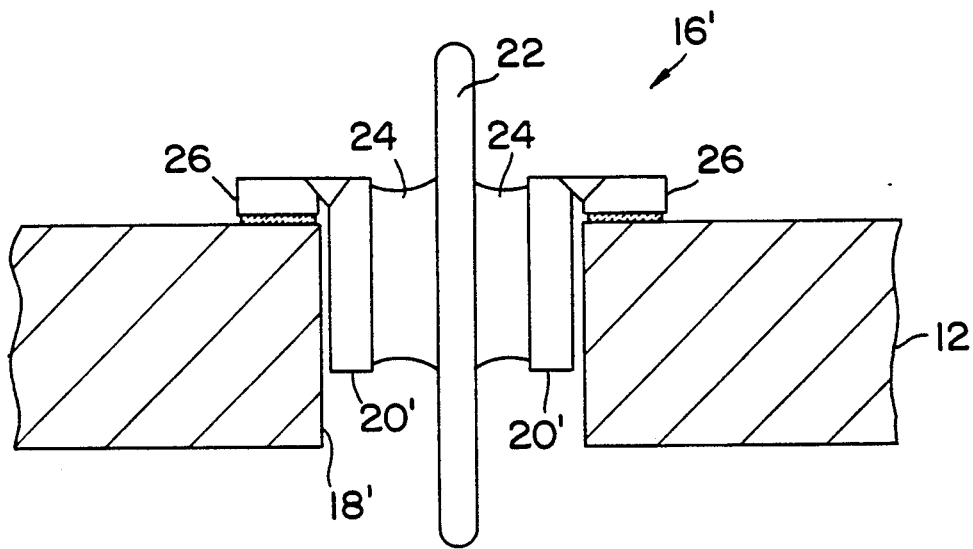
FIG. 3 is an enlarged fragmentary sectional view of an alternative technique in accordance with the present invention for joining a Kovar feedthrough to an aluminum housing.

Opening 18 is shown as having a counterbore to allow the feedthrough 16 to be welded flush with the exterior of the housing 12. However, the feedthrough 16 can also be welded into an opening 18, without a counterbore, as shown in FIG. 3. In this case, the feedthrough 16 would protrude slightly from the housing 12. The openings 18 are slightly larger in diameter than the feedthroughs 16 to allow for the expansion of the aluminum housing 12. The housing 12 is preferably fabricated from an aluminum, such as 6061 T-6 aluminum, but can be fabricated from other high thermal conductivity metals. The cover 14 is preferably fabricated from 4047 aluminum so that it can be easily welded, preferably by laser welding, to the 6061 T-6 aluminum housing 12. The laser welding can be performed by a neodymium-doped yttrium aluminum garnet (YAG) pulsed laser.

FIG. 3 illustrates an alternative technique in accordance with the present invention for joining Kovar feedthroughs 16' to the aluminum housing 12. Each feedthrough 16' includes a non-flanged Kovar shell 20', the Kovar center conductor 22 and the borosilicate sealing glass insulator 24 fused between the Kovar shell 20' and center conductor 22. The Kovar shell 20' is laser welded to a Kovar ferrule 26 that has been friction welded to the housing 12 around an opening 18'. Opening 18' is shown without a counterbore, but the opening can have a counterbore, as shown in FIG. 2.

This alternative technique removes the feedthrough 16' from the friction welding process, thus eliminating any possibility that the sealing glass insulator 24 might be broken due to the large forces exerted on the feedthrough when being driven into the housing 12. Furthermore, the ferrules 26 can be friction welded to a rough-machined block of aluminum, which can better withstand the friction welding than a finished aluminum housing. In the technique shown in FIG. 2, the housing 12 must be machined before the feedthroughs 16 are friction welded into the openings 18, since further machining steps could also break the sealing glass insulator 24. The laser welding can be performed by a neodymium-doped YAG pulsed laser.

Figure 4:
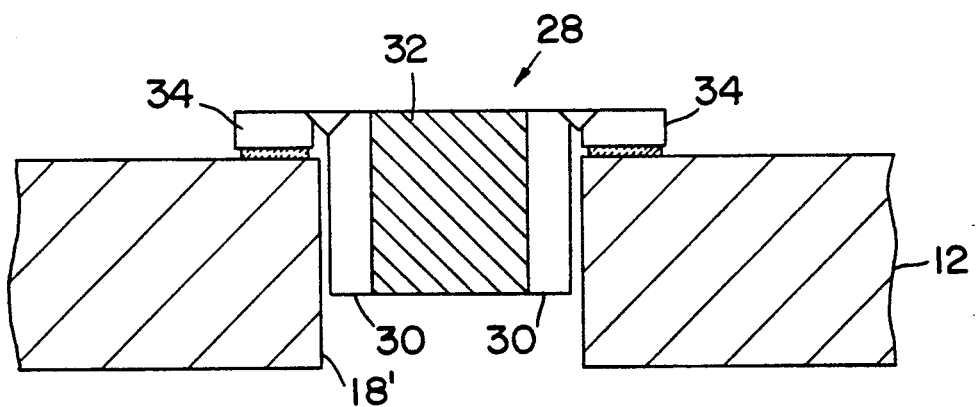
FIG. 4 is an enlarged fragmentary sectional view of an Invar feedthrough in accordance with the present invention for transmitting microwave and optical signals.

FIG. 4 illustrates an alternative feedthrough 28 in accordance with the present invention for transmitting microwave and optical signals. The feedthrough 28 includes a non-flanged Invar shell 30 and a crystal 32 brazed into the center of the Invar shell 30. The crystal 32 can be, for example, quartz, sapphire, lithium niobate (LiNbO$_3$), or any other type of crystal providing noncontact transmission of microwave or optical signals. The Invar shell 30 is laser welded to an Invar ferrule 34 that has been friction welded to the housing 12 around the opening 18'. Although the opening 18, is shown without a counterbore, the opening can have a counterbore, as shown in FIG. 2. In addition, the Invar shell 30 can have a flange that is friction welded to the housing 12 rather than the ferrule 34, as shown in FIG. 2. Invar, alloy of nickel and iron, is used instead of Kovar because it has a CTE that is closer to the CTE's of the various crystals than Kovar.

From the foregoing, it will be appreciated that the present invention represents a significant advance in the field of hybrid packaging techniques. The friction welding technique of the present invention provides an hermetically sealed aluminum hybrid package having a leak rate better than $1 \times 10^{-9}$ atm-cc/sec when measured by a helium mass spectrometer. The aluminum package is easy to machine, light in weight and provides good heat dissipation for the hybrid microcircuits in the package. Although several preferred embodiments of the invention have been shown and described, it will be apparent that other adaptations and modifications can be made without departing from the spirit and scope of the invention. Accordingly, the invention is not to be limited, except as by the following claims.

We claim:

1. A hybrid package, comprising:
   an aluminum housing having at least one opening; and
   a nickel-cobalt-iron alloy electrical feedthrough connector friction welded into each opening in the housing;
   wherein a nickel-cobalt-iron alloy ferrule is friction welded to the housing around each opening and the nickel-cobalt-iron alloy feedthrough connector is laser welded to the ferrule.

2. The hybrid package as set forth in claim 1, wherein each feedthrough connector includes a nickel-cobalt-iron alloy outer shell and center conductor and a borosilicate sealing glass insulator fused between the outer shell and center conductor.

3. A hybrid package, comprising:
   a housing having at least one opening, the housing being fabricated of a thermally conductive metal; and
   a metal electrical feed through connector friction welded into each opening in the housing;
   wherein a metal ferrule is friction welded to the housing around each opening and the metal feedthrough connector is laser welded to the ferrule.

4. The hybrid package as set forth in claim 3, wherein each feedthrough connector includes a metal outer shell and center conductor and a sealing glass insulator fused between the outer shell and center conductor.

* * * * *